United States Patent
Zhou et al.

(10) Patent No.: US 11,810,515 B1
(45) Date of Patent: Nov. 7, 2023

(54) PIXEL DRIVING CIRCUIT, DISPLAY PANEL AND DISPLAY DEVICE

(71) Applicant: HKC CORPORATION LIMITED, Shenzhen (CN)

(72) Inventors: Xiufeng Zhou, Shenzhen (CN); Xin Yuan, Shenzhen (CN); Haijiang Yuan, Shenzhen (CN)

(73) Assignee: HKC CORPORATION LIMITED, Shenzhen (CN)

( * ) Notice: Subject to any disclaimer, the term of this patent is extended or adjusted under 35 U.S.C. 154(b) by 0 days.

(21) Appl. No.: 18/069,567

(22) Filed: Dec. 21, 2022

(30) Foreign Application Priority Data

Jun. 30, 2022 (CN) .......................... 202210756925.3

(51) Int. Cl.
*G09G 3/3258* (2016.01)
*G09G 3/3291* (2016.01)
(Continued)

(52) U.S. Cl.
CPC ......... *G09G 3/3258* (2013.01); *G09G 3/3291* (2013.01); *G09G 3/3233* (2013.01);
(Continued)

(58) Field of Classification Search
CPC .. G09G 3/3258; G09G 3/3291; G09G 3/3233; G09G 2300/0819; G09G 2310/08;
(Continued)

(56) References Cited

U.S. PATENT DOCUMENTS

2010/0253710 A1\* 10/2010 Rankov ................ G09G 3/3291
345/204
2016/0104761 A1\* 4/2016 Tabatake ............. H01L 27/1214
257/40
(Continued)

FOREIGN PATENT DOCUMENTS

CN 1287287 A 3/2001
CN 101409041 A 4/2009
(Continued)

OTHER PUBLICATIONS

Office Action dated May 27, 2023, in corresponding Chinese Application No. 202210756925.3, 14 pages.

*Primary Examiner* — Tom V Sheng
(74) *Attorney, Agent, or Firm* — Maier & Maier, PLLC

(57) ABSTRACT

A pixel driving circuit includes a driving transistor, a voltage stabilizing transistor, and a storage capacitance. A gate metal layer of a gate electrode of the voltage stabilizing transistor that serves as the control terminal of the voltage stabilizing transistor, and an active layer are constituted as a channel on-state capacitance, a ratio of an area of the channel on-state capacitance to a capacitance value of the storage capacitance is less than a preset value the area of the channel on-state capacitance is a directly opposite overlapping area between the gate metal layer and the active layer. This preset value is determined based on a ratio of a voltage fluctuation at a control terminal of the driving transistor to a potential voltage. A correlation between the channel on-state capacitance and the storage capacitance of the voltage stabilizing (Continued)

transistor is determined, so that a new capacitance configuration method is provided.

19 Claims, 3 Drawing Sheets

(51) Int. Cl.
  *H10K 102/00* (2023.01)
  *H10K 50/80* (2023.01)
  *G09G 3/3233* (2016.01)

(52) U.S. Cl.
  CPC . *G09G 2300/0819* (2013.01); *G09G 2310/08* (2013.01); *G09G 2320/0233* (2013.01); *G09G 2320/043* (2013.01); *G09G 2320/045* (2013.01); *H10K 50/80* (2023.02); *H10K 2102/302* (2023.02)

(58) Field of Classification Search
  CPC ....... G09G 2320/043; G09G 2320/045; G09G 2320/0233; H10K 50/80; H10K 2102/302
  USPC .......................................................... 345/55
  See application file for complete search history.

(56) References Cited

U.S. PATENT DOCUMENTS

| | | |
|---|---|---|
| 2017/0358605 A1 | 12/2017 | Choi et al. |
| 2021/0074210 A1* | 3/2021 | Yuan .................... G09G 3/3233 |
| 2022/0319417 A1* | 10/2022 | Liu ...................... G09G 3/3241 |

FOREIGN PATENT DOCUMENTS

| | | |
|---|---|---|
| CN | 105654904 A | 6/2016 |
| CN | 113013218 A | 6/2021 |
| CN | 113937157 A | 1/2022 |
| CN | 114222615 A | 3/2022 |

* cited by examiner

PIXEL DRIVING CIRCUIT, DISPLAY PANEL AND DISPLAY DEVICE

CROSS-REFERENCE TO RELATED APPLICATION

Pursuant to 35 U.S.C. § 119 and the Paris Conversion, this application claims priority to Chinese Patent Application No. 202210756925.3 filed Jun. 30, 2022, the entire contents of which are incorporated herein by reference.

FIELD

The present application relates to the field of displaying technology, and more particularly to a pixel driving circuit, a display panel and a display device.

BACKGROUND

The statements provided herein are merely background information related to the present application, and do not necessarily constitute any prior arts. With the development of the technical field of LCD (Liquid Crystal Display), OLED (Organic Light Emitting Diode) display technology has been gradually widely used in products such as TV (Television), mobile phones, notebooks due to OLED's technological advantages such as self-luminescence, lightness and thinness. Since OLED is a current driven device, when a threshold voltage Vth of a TFT (Thin Film Transistor) is shifted, the current that drives the OLED will be unstable and will be variable. Thus, inhomogeneous luminance is further caused. At present, current compensation is performed through a driving compensation circuit. The driving compensation circuit includes a TFT and a capacitance connected to a pixel, a control terminal of the TFT is connected to a data voltage, an input terminal of the TFT is connected to a drive voltage, an output terminal and a control terminal of the TFT are connected to the capacitance, so that the voltage written into the pixel can be adjusted by the data voltage. The operation process of the pixel driving circuit includes four stages, that is, reset, compensation, writing and luminescence. Due to the fluctuations in a manufacturing process, the magnitude of the threshold voltage is variable, which means that, the current flowing through the channel is variable. The influence on the threshold voltage of a conductive channel constituted by circuit components can be eliminated through an internal compensation circuit. However, researches on the configuration of capacitance in the prior art are insufficient, researches on the influence of different capacitance configurations on the compensation effect are insufficient. Thus, there are many deficiencies in the conventional displaying technology.

SUMMARY

The present application provides a pixel driving circuit, a display panel and a display device, which aim at solving the problem in the exemplary technology that the conventional method for compensating a driving switch using a three-terminal device has reached the peak, there is an insurmountable bottleneck for the development of the conventional method for compensating the driving switch, and it is urgent to provide a compensation method that can surmount the above bottleneck.

In the first aspect, a pixel driving circuit is provided in one embodiment of the present application, the pixel driving circuit is applied to a display panel which includes a plurality of pixels, each of the pixels includes a plurality of sub-pixels, the pixel driving circuit includes:

a driving and compensation sub-circuit, the driving and compensation sub-circuit includes a driving transistor and a storage capacitance, an input terminal of the driving transistor is coupled to a driving voltage terminal, a control terminal of the driving transistor is coupled to one end of the storage capacitance, the other end of the storage capacitance and an output terminal of the driving transistor are commonly coupled to a corresponding sub-pixel of the plurality of sub-pixels.

The pixel driving circuit further includes a voltage stabilizing transistor. An input terminal of the voltage stabilizing transistor is coupled to a preset voltage terminal, an output terminal of the voltage stabilizing transistor is coupled to a control terminal of the driving transistor, and a control terminal of the voltage stabilizing transistor is coupled to a first gate control signal line.

A gate metal layer of a gate electrode of the voltage stabilizing transistor that serves as the control terminal of the voltage stabilizing transistor, and an active layer constitute a channel on-state capacitance, a ratio of an area of the channel on-state capacitance to a capacitance value of the storage capacitance is less than a preset value. The area of the channel on-state capacitance is a directly opposite overlapping area between the gate metal layer and the active layer, and the preset value is determined based on a ratio of a voltage fluctuation for driving the control terminal of the driving transistor to a potential voltage.

In an optional embodiment, a ratio of the voltage fluctuation at the control terminal of the driving transistor to the potential voltage is 5%, correspondingly, the preset value is $3.74\ \text{E}^{-10}$.

In an optional embodiment, the pixel driving circuit further includes:

a data write sub-circuit. An output terminal of the data write sub-circuit is coupled between the output terminal of the driving transistor and an input terminal of the sub-pixel, and is configured to write a data voltage into the driving transistor in compensation and writing stage.

In an optional embodiment, the data write sub-circuit includes:

a writing control transistor, a control terminal of the writing control transistor is coupled to a second gate control signal line, an input terminal of the writing control transistor is coupled to a data voltage terminal, and an output terminal of the writing control transistor is coupled to the output terminal of the driving transistor.

In an optional embodiment, the pixel driving circuit further includes:

a reset sub-circuit configured to pull down a voltage at one end of the storage capacitance coupled to the sub-pixel to a reset voltage, in response to a reset response voltage output by a reset response voltage line.

In an optional embodiment, the reset response voltage line is the first gate control signal line. The reset sub-circuit includes a reset control transistor, a control terminal of the reset control transistor is coupled to the reset response voltage line, an input terminal of the reset control transistor is coupled to a reference direct current voltage terminal, and an output terminal of the reset control transistor is coupled to the output terminal of the driving transistor.

In an optional embodiment, the pixel driving circuit further includes:

a first luminance control transistor, a control terminal of the first luminance control transistor is coupled to a first luminance control signal line, an input terminal of the first luminance control transistor is coupled to the driving voltage terminal, and an output terminal of the first luminance control transistor is coupled to the input terminal of the driving transistor.

The pixel driving circuit further includes a second luminance control transistor, a control terminal of the second luminance control transistor is coupled to a second luminance control signal line, an input terminal of the second luminance control transistor is coupled to the output terminal of the driving transistor, and an output terminal of the second luminance control transistor is coupled to the sub-pixel.

In an optional embodiment, the preset voltage terminal is the driving voltage terminal; alternatively, the preset voltage terminal is a direct current signal terminal in the display panel.

In the second aspect, a display panel is provided in one embodiment of the present application. The display panel includes a plurality of pixels and a plurality of the aforesaid pixel driving circuits. Each of the plurality of pixels includes a plurality of sub-pixels, and the sub-pixels in each of the plurality of pixels are coupled with the plurality of pixel driving circuits, respectively.

In the third aspect, a display device is provided in one embodiment of the present application, the display device includes a display panel and the aforesaid pixel driving circuit, the display panel includes a plurality of pixels, and each of the pixels includes a plurality of luminescent devices.

BRIEF DESCRIPTION OF THE DRAWINGS

In order to describe the embodiments of the present application or the existing technology more clearly, a brief introduction regarding the accompanying drawings that need to be used for describing the embodiments of the present application or the existing technology is given below. It is obvious that the accompanying drawings described below are merely some embodiments of the present application, a person of ordinary skill in the art may also acquire other drawings according to the current drawings without paying creative labor.

DETAILED DESCRIPTION OF THE EMBODIMENTS

In order to make the purpose, the technical solutions and the advantages of the present application be clearer and more understandable, the present application will be further described in detail below with reference to accompanying figures and embodiments. It should be understood that the embodiments described in detail herein are merely intended to illustrate but not to limit the present application.

Additionally, terms such as "the first" and "the second" are merely for the purpose of illustration, and thus should not be considered as indicating or implying any relative importance, or implicitly indicating the number of indicated technical features. Thus, technical feature(s) restricted by "the first" or "the second" may include one or more such technical feature(s) explicitly or implicitly. In the description of the present application, "a plurality of" has the meaning of at least two, unless there is additional explicit and specific limitation. It should be noted that the pixel driving circuit, the display panel and the display device disclosed in the present application can be used in the field of displaying technology or other fields other than the field of displaying technology. The application fields of the pixel driving circuit, the display panel and the display device disclosed in the present application are not limited.

First Embodiment

Figure 1:
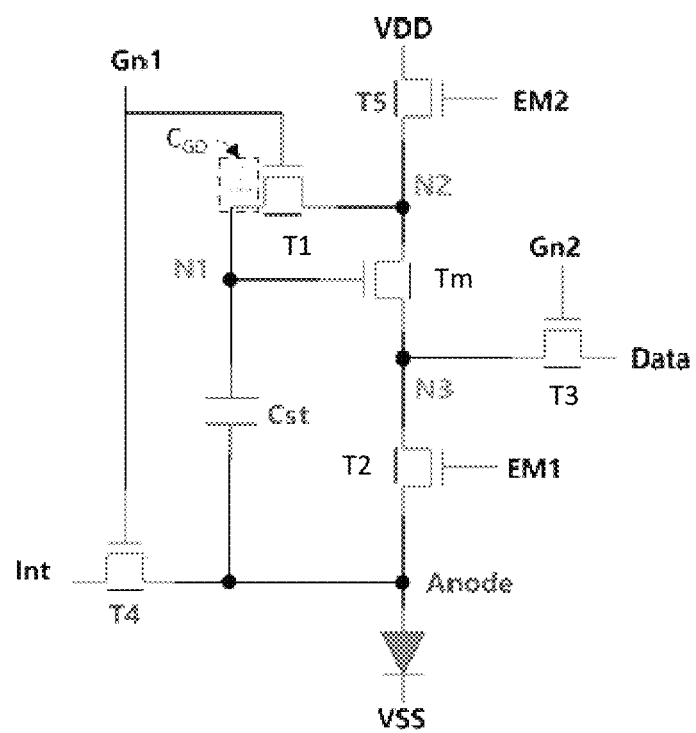
FIG. 1 illustrates a schematic circuit configuration diagram of a pixel driving circuit according to one embodiment of the present application.

FIG. 1 is a schematic circuit configuration diagram of a pixel driving circuit provided in this embodiment of the present application. It can be known that the pixel driving circuit of the present application is used in a display panel, the display panel includes a plurality of pixels, each of the pixels includes a plurality of sub-pixels M. The pixel driving circuits are coupled with the sub-pixels M, respectively. As shown in FIG. 1, each pixel driving circuit includes a driving and compensation sub-circuit 10. The driving and compensation sub-circuit 10 includes a driving transistor TM and a storage capacitance Cst. An input terminal of the driving transistor TM (i.e., the terminal 11 of the driving transistor Tm shown in FIG. 2) is coupled to the drive voltage terminal VDD, a control terminal (i.e., the terminal 13 of the driving transistor Tm shown in FIG. 2) is coupled to one terminal (i.e., cs1 shown in FIG. 2) of the storage capacitance Cst, the other end (i.e., cs2 shown in FIG. 2) of the storage capacitance and an output terminal (i.e., the terminal 12 of the driving transistor Tm shown in FIG. 2) of the driving transistor Tm are commonly coupled to the corresponding sub-pixel M. The pixel driving circuit further includes a voltage stabilizing transistor T2, an input terminal 21 of the voltage stabilizing transistor T2 is coupled to a preset voltage terminal (i.e., the multiplexed driving voltage terminal VDD shown in FIG. 1 is the preset voltage terminal), an output terminal 22 of the voltage stabilizing transistor T2 is coupled to a control terminal 13 of the driving transistor Tm, and a control terminal 23 of the voltage stabilizing transistor T2 is coupled to a first gate control signal line Gn1.

Figure 3:
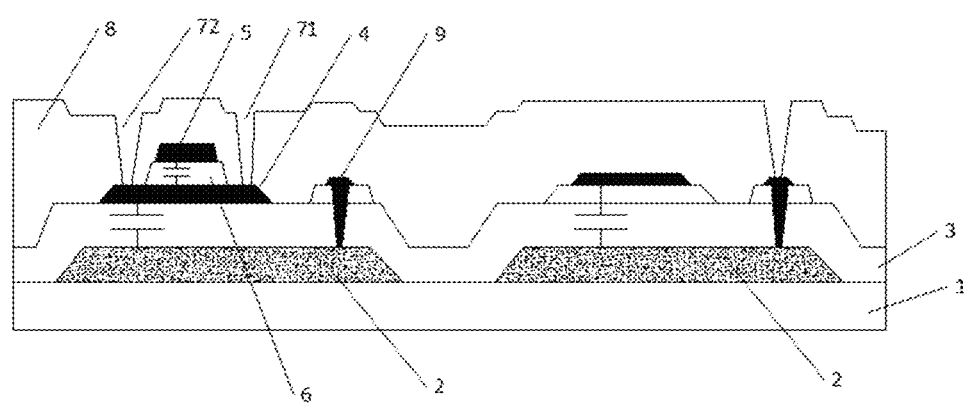
FIG. 3 illustrates a schematic laminated structure of a driving switch in FIG. 1.

As shown in FIG. 3, in this embodiment of the present application, the area of the channel on-state capacitance is a directly opposite overlapping area of the gate metal layer 5 that serves as the control terminal of the voltage stabilizing transistor T2, and the active layer 4. This area is also referred to as "overlapping area of orthographic projection". A correlation between the overlapping area of the gate metal layer and the active layer, and the capacitance value of the storage capacitance is expressed as s<Cst*k. Where, s represents the directly opposite overlapping area between the gate metal layer and the active layer, Cst represents the capacitance value of the storage capacitance, K is determined based on a ratio of the voltage fluctuation at the control terminal of the driving transistor to the potential voltage.

In particular, the value of Cgd is determined by a result of multiplication of an area S of a transistor T1 and capacitance per unit area. Based on the principle of plane-parallel capacitor, a formula is expressed as $C=\varepsilon S/4\pi kd$. In this formula, c represents a relative dielectric constant, d represents a distance between two plates, and k represents an electrostatic force constant. Generally, since the thickness of each layer structure in the transistor of the display panel has been optimally designed, an electron breakdown effect is prone to occur if the thickness d of each layer of the transistor is too thin. If the thickness d is too thick, the time of process of production and the performance of the devices are not prone to reach the standard. Therefore, generally, D is set to be a fixed value, so that a mathematical relationship between S of transistor T1 and Cst can be deduced.

Based on the aforesaid rationale, a derivation process is described as follows: if Cgd/(Cgd+Cst) is less than 5%, then, Cgd is less than 0.05/0.95 Cst. Moreover, Cgd is equal to $\varepsilon_0\varepsilon_i$ S/2T. Thus, S is less than 0.05 Cst/(0.95×2T$\varepsilon_0\varepsilon_i$). Then, S×10$^{-12}$ (um$^2$) is less than 0.05 Cst/(0.95×2T$\varepsilon_0\varepsilon_i$)×1200×10$^{-10}$. At last, a mathematical relationship of s<Cst*3.74e$^{-10}$ is deduced.

It should be understood that, in this embodiment, $\varepsilon_0$, $\varepsilon_1$ and T are vacuum dielectric constant, relative dielectric constant and thickness, respectively.

In this embodiment of the present application, hardware configuration parameters of the channel on-state capacitance are changed with reference to the circuit configuration, by ingeniously changing the channel capacitance value, so that a compensation is performed and a display effect is improved. Moreover, the corresponding relationship between the area of the channel on-state capacitance and the capacitance value of the storage capacitance is determined, so that the voltage fluctuation caused due to capacity coupling during a switching-off process of the driving transistor is avoided according to the corresponding relationship between the area of the channel on-state capacitance and the capacitance value of the storage capacitance, and the compensation.

In this embodiment, a problem that there is a lack of researches and discussions related to capacitance design for improving the display effect is solved. In this embodiment of the present application, the ratio of the voltage fluctuation to the potential voltage is enabled to be less than 5%, that is, Cgd/(Cgd+Cst)<5%. Then, a formula of S<Cst*3.74E$^{-10}$ is determined with reference to the deduction process. In this formula, S represents the area of the channel open-state capacitance (i.e., the directly opposite overlapping area of the gate metal layer and the active layer), Cst represents a capacitance value of the storage capacitance.

It can be seen that, first, in the existing electric circuit, the voltage fluctuation caused by capacity coupling during the switching-off process of transistor T1 is also affected by a voltage stabilizing effect of the storage capacitance Cst. Currently, there is no concept of designing a channel on-state capacitance of the transistor T1, the problem of capacity coupling can be overcome by configuring a capacitance value for the channel capacitance of the driving transistor. The voltage fluctuation caused by capacity coupling during switching-off process of the transistor T1 is also affected by a voltage stabilizing effect of storage capacitance Cst, the voltage fluctuations at a node N1 connected to the gate of the driving TFT are also different due to voltage fluctuations of different gray levels. In the present application, the ratio of the voltage fluctuation to the potential voltage is less than 5%, that is, Cgd/(Cgd+Cst)<5%. Thus, the size of Cgd depends on the result of multiplication of the area S of the transistor T1 and the capacitance per unit area, the mathematical relationship between the area S of transistor T1 and the storage capacitance Cst is obtained, that is, S<Cst*3.74E$^{-10}$.

Figure 2:
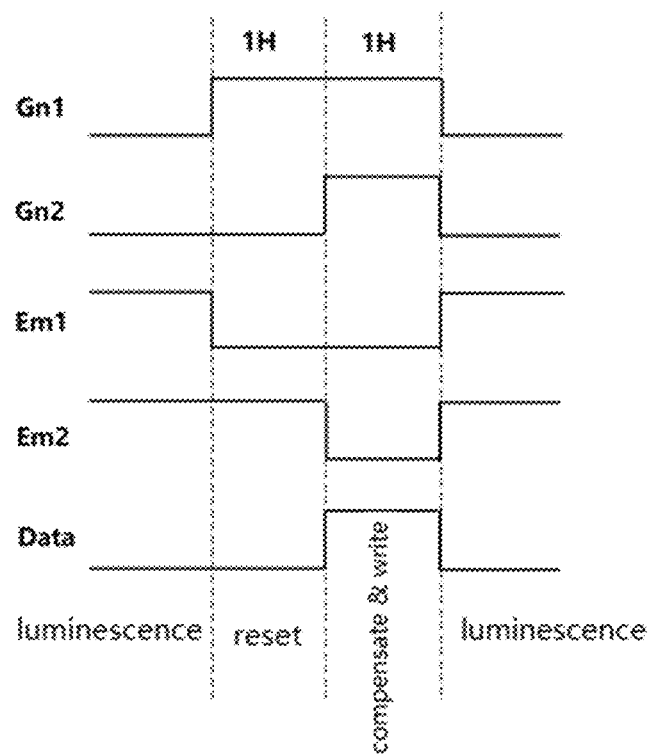
FIG. 2 illustrates a schematic diagram of timing control corresponding to FIG. 1.

It can be understood that, in the embodiments corresponding to FIG. 1 and FIG. 2 in the present application, the multiplexed driving voltage terminal VDD is the preset voltage terminal. In other optional embodiments, the preset voltage terminal VDD may be any one of high level voltage terminals in the display panel, the preset voltage terminal VDD is not limited in the present application, it only needs to set the voltage value of the high level voltage terminal to be higher than the threshold value of the gate control voltage of the voltage stabilizing transistor (e.g., as for a conventional transistor, this transistor can be switched-on at a voltage of 0.7V or above 0.7V. That is, it only needs to set the voltage value of the high level voltage terminal to be greater than 0.7V).

The specific circuit configuration of the voltage stabilizing transistor of the present application will be described in detail below. The voltage stabilizing transistor is a conventional TFT (Thin Film Transistor) device which includes a source electrode, a drain electrode and a gate electrode. The gate electrode and an active layer can be constituted as a channel on-state capacitance.

In one preferable embodiment, as shown in FIG. 3, FIG. 3 illustrates a schematic circuit configuration of the voltage stabilizing transistor according to this embodiment of the present application, the voltage stabilizing transistor includes: a substrate 1; a first metal layer 2 formed on one side surface of the substrate 1; an active layer 4 formed on one side of the first metal layer 2 away from the substrate 1; a switching element structure located on one side of the active layer 4 away from the first metal layer 2, the switching element structure includes a gate electrode composed of a second metal layer 5, a source electrode (formed by depositing metal in the via 72 in FIG. 1) and a drain electrode (formed by depositing metal in the via 71 in FIG. 1), the source electrode and the drain electrode are located at the two sides of the second metal layer 5 and are in electrical contact with the active layer 4. The first metal layer 2 is coupled to a DC (Direct Current) voltage terminal.

In this embodiment of the present application, the substrate, also known as underlayer, is a clean single crystal wafer provided with specific crystal plane and appropriate electrical, optical and mechanical characteristics, and the substrate is used for supporting epitaxial layers. The substrate is not repeatedly described here. It should be understood that the present application relates to the field of displaying. Thus, the substrate described herein is generally a glass substrate provided with a mechanical port function. Each of the various layer structures can be formed on the substrate through a method such as a deposition method, etc.

In this embodiment of the present application, the first metal layer 2 is formed on one side surface of the substrate 1. The first metal layer 2 constitutes a bottom gate of the TFT in this embodiment of the present application. In the present application, the bottom gate can be electrically connected to an external DC (Direct Current) wire through the conductive metal 9 deposited in the via. For example, one end terminal of the DC wire is welded to the conductive metal on the via.

The active layer is formed on one side of the first metal layer 2 away from the substrate 1, that is, the active layer 1 is located above the first metal layer 2. During a fabrication process, a buffer layer 3 may be arranged between the active layer 4 and the first metal layer 2. In one aspect, an electric isolation function is realized. In another aspect, mechanical support and mechanical cushioning are provided.

The second metal layer 5 is formed on the active layer 4. The second metal layer 5 forms a top gate. A gate insulating film (GI) layer 6 may be arranged between the second metal layer 5 and the active layer 4.

Additionally, an interlayer medium 8 is deposited on the active layer 4. Then, an exposure and mask process is performed on the interlayer medium 8 so as to form a pair of vias 71 and 72 on the active layer 4. Then, metals are deposited on the vias 71 and 72 to form the source electrode and the drain electrode located on both sides of the second metal layer 5 and being in electrical contact with the active layer 4. In this way, the structure of the switching element of the present application is formed. The method includes: taking the conductive metals deposited in the pair of vias as the source electrode and the drain electrode, and taking the second metal layer as a gate electrode.

In this embodiment, according to the layer structure arrangement of the TFT having the aforesaid structure, since the first metal layer is coupled to the DC voltage terminal, so that the voltage of the first metal layer is stabilized at the voltage of the DC voltage terminal, a capacitance Cgd2 is formed between the first metal layer and the active layer, and another capacitance Cgd is formed between the second metal layer and the active layer. It should be understood that, since a value of a capacitance is proportional to the area of the electrode plates for forming the capacitance. However, the size of the first metal layer served as the bottom gate is not restricted (there is no interference from other devices or layer structures at the position of the bottom gate). Therefore, under an extreme condition, the first metal layer served as the bottom gate can cover the entire substrate. In actual use, the coverage area of the first metal layer is generally smaller than the entire substrate area under control.

Furthermore, as for the circuit in FIG. 1 of the present application, in the manufacturing process of the circuit, the first metal layer 2 and the second metal layer 5 are extended to form two surfaces which are adjacent and exposed to each other, such that the capacitance Cst can be formed between the first metal layer 2 and the second metal layer 5.

It can be seen that, in the present application, the first metal layer is configured and is coupled to the DC voltage terminal, the capacitance Cgd2 is additionally provided as compared to the three-terminal TFT in the exemplary technology. Furthermore, a plate area of Cgd2 can be configured under a relatively unrestricted environment. Thus, in one aspect, the capacitance Cgd2 can have a larger size. In another aspect, the capacitance value of the capacitance Cgd2 can be flexibly adjusted, so that the TFT is made as a 4-terminal device in the present application, a metal layer is used as the bottom gate of the device at the opposite side of the insulating layer at the bottom of the device. The bottom gate is connected to a DC signal in the circuit. The capacitance Cgs2 is formed between the bottom gate, and the source electrode and the drain electrode of the device. Since the area of the bottom gate usually covers the other electrodes of the device, the capacitance of the newly formed capacitance Cgs2 has a great capacitance value. When a capacity coupling effect occurs, the potential change of the control terminal of the driving transistor depends on the parasitic capacitance of the writing control transistor, the capacitance value of the storage capacitance of the control terminal of the driving transistor, and the capacitance value of the newly formed capacitance Cgd2. Therefore, the capacitance Cgd and the capacitance Cgs2 can be used as fixed voltage stabilizing capacitors which are used for effectively offset the influence of capacitance feedthrough effect of the capacitance Cgd and the capacitance Cgs, so that a better display effect of pixels is further guaranteed.

The driving transistor T1 is shown in FIG. 1 and FIG. 2. An input terminal of the driving transistor T1 is coupled to a driving voltage terminal VDD, and an output terminal of the driving transistor T1 is coupled to the pixel driving circuit to be compensated. The voltage stabilizing transistor T2 is the TFT (Thin Film Transistor) as described in the first embodiment, and the second metal layer of the voltage stabilizing transistor T2 is coupled to the first gate control signal line Gn1, the first metal layer of the voltage stabilizing transistor T2 is coupled to the DC signal line, the source electrode of the voltage stabilizing transistor T2 is coupled to the input terminal of the driving transistor T1, and the drain electrode of the voltage stabilizing transistor T2 is coupled to the control terminal of the driving transistor T1. Thus, in use, the voltage at the control terminal of driving transistor T1 is attenuated gradually with time went on. In this condition, the transistor T2 is switched on in the reset and compensation processes, and the driving voltage in the VDD line is transmitted to the voltage stabilizing transistor T2 to "charge" the capacitance Cgd and the capacitance Cgd2. Then, when the voltage stabilizing transistor T2 is switched-off, the voltage at the control terminal of transistor T1 is compensated by the capacitance Cgd and the capacitance Cgd2 if the voltage at the control terminal of transistor T1 is attenuated. Moreover, the voltage at the control terminal of driving transistor T1 is also compensated by the capacitance Cst. That is, in this embodiment of the present application, the voltage at the control terminal of the driving transistor T1 can be compensated by the capacitance Cst, the capacitance Cgd and the capacitance Cgd2 if the voltage at the control terminal of the driving transistor T1 is attenuated. Thus, attenuation of the voltage at the control terminal of driving transistor T1 is not prone to occur. Furthermore, the capacitance Cgd and the capacitance Cgs2 can be served as the fixed voltage stabilizing capacitors for effectively offsetting the feedthrough effect of the capacitance Cgd and the capacitance Cgs, so that the better display effect of pixels are further guaranteed.

In this embodiment of the present application, further referring to FIG. 1, the pixel driving circuit of the present application further includes a data write sub-circuit 30. An output terminal of the data write sub-circuit 30 is coupled between the output terminal 22 of the driving transistor T1 and the input terminal of the corresponding sub-pixel M, and is used for writing a data voltage into the driving transistor T1 in the compensation and writing stage.

Figure 4:
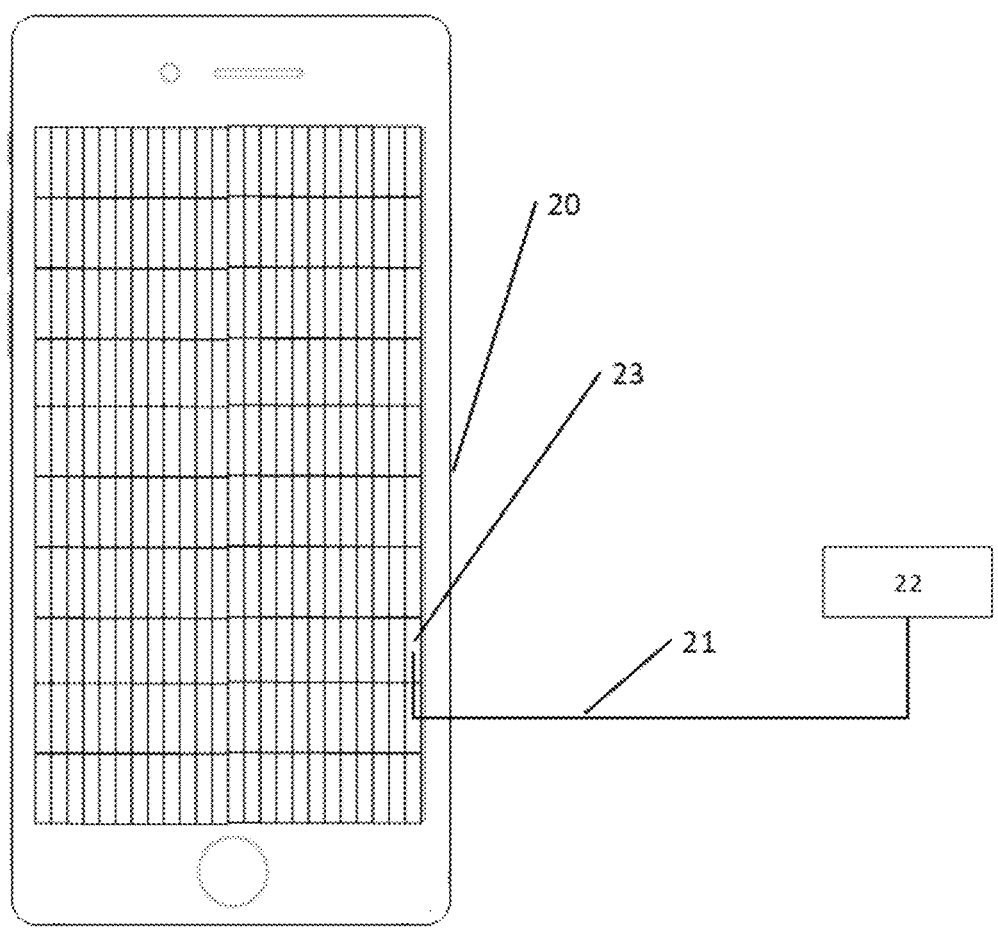
FIG. 4 illustrates a schematic structural diagram of the display device according to one embodiment of the present application.

A detailed structural diagram of a data write sub-circuit is provided below. As shown in FIG. 4, the data write sub-circuit 30 according to this embodiment of the present application includes a writing control transistor T3. A control terminal of the writing control transistor T3 is coupled to a second gate control signal line Gn2, an input terminal of the writing control transistor T3 is coupled to a data voltage terminal Data, and an output terminal of the writing control transistor T3 is coupled to an output terminal of the driving transistor T1. In particular, during a data writing process, the control terminal 13 of the driving transistor T1 performs discharging operation on the data voltage terminal Vdata, the discharging operation is stopped when the voltage at the data voltage terminal Vdata has reached the threshold voltage Vth (e.g., 0.7V) of the data voltage terminal Vdata. In this condition, a Vdata signal is written with respect to the driving transistor T1.

Furthermore, as shown in FIG. 1 and FIG. 2, in one preferable embodiment, the pixel driving circuit in the embodiment of the present application further includes a reset sub-circuit 40, the reset sub-circuit 40 is configured to pull down the voltage at one end of the storage capacitance coupled to the sub-pixel to a reset voltage, in response to a reset response voltage as output from a reset response voltage line.

In one preferable embodiment, the reset response voltage line is the first gate control signal line. The reset response voltage line can also be any other lines having high-level, as long as the timing meets the requirement. That is, the reset response voltage line has a high level in the reset stage and the compensation stage.

In one preferable embodiment, the reset sub-circuit 40 of the present application includes a reset control transistor T4. A control terminal of the reset control transistor T4 is coupled to the first gate control signal line Gn1, an input terminal of the reset control transistor T4 is coupled to a reference DC voltage terminal int, and an output terminal of the reset control transistor T4 is coupled to the output terminal 11 of the driving transistor T1.

Furthermore, the pixel driving circuit in this embodiment of the present application further includes a first luminance control transistor T5. A control terminal of the first luminance control transistor T5 is coupled to a first luminance control signal line EM2, an input terminal of the first luminance control transistor T5 is coupled to the driving voltage terminal VDD, and an output terminal of the first luminance control transistor T5 is coupled to the input terminal 11 of the driving transistor T1.

Furthermore, the pixel driving circuit in this embodiment of the present application further includes a second luminance control transistor T2. A control terminal of the second luminance control transistor T2 is coupled to a second luminance control signal line EM1, an input terminal of the second luminance control transistor T2 is coupled to the output terminal 12 of the driving transistor T1, and an output terminal of the second luminance control transistor T2 is coupled to the sub-pixel M.

In the present application, the first luminance control transistor T5 and the second luminance control transistor T2 are used to switch a timing control stage, thereby generating a circuit control method in the reset stage, the compensation stage and the writing and luminescence stage with reference to the structure of the device. The details of circuit control method are described below:

In the present application, the compensation process and the driving process of the present application are described in detail with reference to the timing diagram shown in FIG. 5.

During use, performing compensation operation by a pixel compensation module usually includes four stages, that is, a reset stage, a compensation stage, a writing stage and a luminescence stage.

First, in the reset stage, jumping, through the control line EM1, to a low potential to switch off the transistor T2 is performed, so that a path for luminescence is cut off. A transistor T5, a transistor T1 and a transistor T4 are switched on by the control line EM2 and the scanning line Gn1, the first end and the second end of the storage capacitance Cst are charged until the first end and the second reach the initial potential VDD and Int, respectively;

In this pixel driving circuit, compensation operation and writing operation are in the same stage. In this stage, the transistor T3 is switched on through the scanning line Gn2. The source electrode of the transistor Tm is connected to the data signal. The transistor T3 stores the data signal and the threshold voltage of the transistor Tm in the gate electrode of the transistor Tm through self-discharging.

In the luminescence stage, the first gate control signal line Gn1 and the second gate control signal line Gn2 are jumped to low potential. The transistor T1, the transistor T3 and the transistor T4 are switched off. The transistor T5, the transistor Tm, the transistor T2 and the OLED (Organic Light Emitting Diode) are constituted as a conductive path, so that the influence of the threshold voltage of the transistors on the gray scale of pixel display can be eliminated.

In this embodiment of the present application, the sub-pixels m are organic self-illumination film devices, and each of the sub-pixels M may be one of the three sub-pixels (i.e., red sub-pixel, green sub-pixel and blue sub-pixel). In particular, three sub-pixels M are combined to constitute a complete pixel, and a color adjustment is performed by adjusting the driving voltage of each of the sub-pixels M in the pixel.

It can be understood that, in the present application, a pixel is the smallest integrated unit that constitutes a pixel arrangement. This pixel arrangement constitutes a display area of the entire display panel (the panel to be compensated in the present application). That is, the pixel arrangement includes a plurality of pixels arranged in a specific pixel arrangement. Each pixel is electrically connected to a driving IC (Integrated Circuit) through one single driving line, and the driving IC is used to drive the sub-pixels in the pixels to be energized to emit color light.

It can be known from above descriptions that, a pixel generally includes a blue sub-pixel, a red sub-pixel and a green sub-pixel. In a preferable embodiment, the pixel may also include a sub-pixel with other color, and said other color may be different from red, blue and green. For example, said other color may include white, yellow or cyan. It should be noted that, if said other color is white, the luminance of the display device having this pixel arrangement structure can be improved. If said other color is yellow or cyan, the color gamut of the display device having this pixel arrangement structure can be increased. Said other color is not repeatedly described here.

In this embodiment of the present application, the pixel driving circuit in the present application is applied in OLED display device. Correspondingly, in one preferable embodiment, the driving transistor and the TFT (Thin Film Transistor) used as voltage stabilizing transistors in the present application may be LTP (Low Temperature Poly Silicon) thin film transistors or other oxide thin film transistor. The types of the transistors are not limited in the present application.

Furthermore, the switching elements (e.g., the driving transistor T1) in the present application are all thin film transistors. In one embodiment, the thin film transistors may be IGZO (Indium Gallium Zinc Oxide) thin film transistors. The types of the switching elements are not limited in the present application.

Furthermore, it should be noted that, "coupling" or "coupled to" in this embodiment of the present application may refer to a direct electrical connection or an indirect electrical connection. For example, if A is coupled to B, A and B can be electrically connected directly through wires or through a wireless signal transmission channel. As an alternative, A and B can be electrically connected through C. For example, A and B are directly connected to C through wires, or A transmits a signal to C, then, C transmits the signal to B, so that there is an indirect connection between A and B.

It should be understood that, in the pixel driving circuit according to the present application, a correlation relationship between the channel on-state capacitance and the storage capacitance of the voltage stabilizing transistor is determined, so that a new capacitance configuration method is provided, the variables that cause voltage fluctuations can be controlled, and the influence on the potential caused due to the differences in the characteristics of devices, which are further caused due to fluctuations in manufacturing process, can be effectively reduced. Thus, the optimal display quality and the optimal display effect are realized.

Second Embodiment

A display panel is further provided in this embodiment of the present application. The display panel includes a plurality of pixels, each pixel includes a plurality of sub-pixels. The display panel further includes the aforesaid pixel driving circuit, each pixel driving circuit is coupled to a sub-pixel and is configured to control the voltage exerted on the sub-pixel, thereby adjusting the luminance of the display panel.

The pixels are arranged in an array generally. The arrangement of the pixels can also be determined according to the actual requirement, the arrangement of the pixels is not limited in the present application.

Third Embodiment

As shown in FIG. 5, a display device 20 in this embodiment of the present application includes the display panel and a plurality of the pixel driving circuit 22 as disclosed in the first embodiment. The display panel includes a plurality of pixels, and the pixel driving circuits are coupled to the sub-pixels of the plurality of pixels through conducting wires 21.

In implementation, the display device according to the embodiment of the present application can be any product or component having displaying function, such as mobile phone, tablet computer, TV, display, notebook computer, digital photo frame, navigator, etc.

It should be understood that, according to the pixel driving circuit of the display panel of the present application, a correlation relationship between the channel on-state capacitance and the storage capacitance of the voltage stabilizing transistor is determined, so that a new capacitance configuration method is provided, the variables that cause voltage fluctuations can be controlled, the impact on the potential caused due to the differences in the characteristics of devices, which are further caused due to fluctuations in manufacturing process, can be effectively reduced. Thus, the optimal display quality and the optimal display effect are realized.

Fourth Embodiment

A method for driving a display device is further provided in this embodiment of the present application. This method is applied to a display panel. The display panel includes a plurality of pixels, each of the pixels includes a plurality of sub-pixels. The pixel driving method includes driving the plurality of sub-pixels through the aforesaid pixel driving circuit.

The steps of the present application will be described in detail with reference to the embodiments corresponding to FIG. 1 and FIG. 2.

FIG. 1 is a timing diagram corresponding to the embodiment of FIG. 1. As shown in FIG. 2, the whole process is divided into four stages.

First, in the reset stage, jumping, through the control line EM1, to a low potential to switch off the transistor T2 is performed, so that a path for luminescence is cut off. A transistor T5, a transistor T1 and a transistor T4 are switched on by the control line EM2 and the scanning line Gn1, the first end and the second end of the storage capacitance Cst are charged until the first end and the second reach the initial potential VDD and Int, respectively;

In this pixel driving circuit, compensation operation and writing operation are in the same stage. In this stage, the transistor T3 is switched on through the scanning line Gn2. The source electrode of the transistor Tm is connected to the data signal. The transistor T3 stores the data signal and the threshold voltage of the transistor Tm in the gate electrode of the transistor Tm through self-discharging.

In the luminescence stage, the first gate control signal line Gn1 and the second gate control signal line Gn2 are jumped to low potential. The transistor T1, the transistor T3 and the transistor T4 are switched off. The transistor T5, the transistor Tm, the transistor T2 and the OLED (Organic Light Emitting Diode) are constituted as a conductive path, so that the influence of the threshold voltage of the transistors on the gray scale of pixel display can be eliminated.

It can be seen from the above technical solution that, in the pixel driving method according to the embodiment of the present application, a correlation relationship between the channel on-state capacitance and the storage capacitance of the voltage stabilizing transistor is determined, so that a new capacitance configuration method is provided, the variables that cause voltage fluctuations can be controlled, the impact on the potential caused due to the differences in the characteristics of devices, which are further caused due to fluctuations in manufacturing process, can be effectively reduced. Thus, the optimal display quality and the optimal display effect are realized.

It should be noted that, regarding the embodiment of the pixel driving circuit, the embodiment of the display device, the embodiment of the pixel driving method according to the embodiments of the present application, reference can be made to each other, and these embodiments are not limited in the present application. Improved methods, which can be easily thought out by any person who is skilled in the art and is familiar with the technical field within the technical scope disclosed in the present application, should all be included in the protection scope of the present application. Thus, these improved methods are not repeatedly described here.

The foregoing embodiments are only some preferable embodiments of the present application, and should not be regarded as limitations to the present application. All modifications, equivalent replacements and improvements, which are made within the spirit and the principle of the present application, should all be included in the protection scope of the present application.

What is claimed is:

1. A pixel driving circuit, which is applied to a display panel comprising a plurality of pixels, each of the pixels comprises a plurality of sub-pixels, the pixel driving circuit comprising:

a driving and compensation sub-circuit, wherein the driving and compensation sub-circuit comprises a driving transistor and a storage capacitance, an input terminal of the driving transistor is coupled to a driving voltage terminal, a control terminal of the driving transistor is coupled to one end of the storage capacitance, an other end of the storage capacitance and an output terminal of the driving transistor are commonly coupled to a corresponding sub-pixel of the plurality of sub-pixels; and a voltage stabilizing transistor, wherein an input terminal of the voltage stabilizing transistor is coupled to a preset voltage terminal, an output terminal of the voltage stabilizing transistor is coupled to a control terminal of the driving transistor, and a control terminal of the voltage stabilizing transistor is coupled to a first gate control signal line; wherein,
a gate metal layer of a gate electrode of the voltage stabilizing transistor that serves as the control terminal of the voltage stabilizing transistor, and an active layer constitute a channel on-state capacitance, a ratio of an area of the channel on-state capacitance to a capacitance value of the storage capacitance is less than a preset value, wherein the area of the channel on-state capacitance is a directly opposite overlapping area between the gate metal layer and the active layer, and the preset value is determined based on a ratio of a voltage fluctuation for driving the control terminal of the driving transistor to a potential voltage.

2. The pixel driving circuit of claim 1, wherein a ratio of the voltage fluctuation at the control terminal of the driving transistor to the potential voltage is 5%, correspondingly, the preset value is $3.74\ E^{-10}$.

3. The pixel driving circuit of claim 1, further comprising:
a data write sub-circuit, wherein an output terminal of the data write sub-circuit is coupled between the output terminal of the driving transistor and an input terminal of the sub-pixel, and is configured to write a data voltage into the driving transistor in a compensation and writing stage.

4. The pixel driving circuit of claim 3, wherein the data write sub-circuit comprises:
a writing control transistor, wherein a control terminal of the writing control transistor is coupled to a second gate control signal line, an input terminal of the writing control transistor is coupled to a data voltage terminal, and an output terminal of the writing control transistor is coupled to the output terminal of the driving transistor.

5. The pixel driving circuit of claim 3, further comprising:
a first luminance control transistor, wherein a control terminal of the first luminance control transistor is coupled to a first luminance control signal line, an input terminal of the first luminance control transistor is coupled to the driving voltage terminal, and an output terminal of the first luminance control transistor is coupled to the input terminal of the driving transistor; and
a second luminance control transistor, wherein a control terminal of the second luminance control transistor is coupled to a second luminance control signal line, an input terminal of the second luminance control transistor is coupled to the output terminal of the driving transistor, and an output terminal of the second luminance control transistor is coupled to the sub-pixel.

6. The pixel driving circuit of claim 1, further comprising:
a reset sub-circuit configured to pull down a voltage at one end of the storage capacitance coupled to the sub-pixel to a reset voltage, in response to a reset response voltage output by a reset response voltage line.

7. The pixel driving circuit of claim 6, wherein the reset response voltage line is the first gate control signal line; and/or
the reset sub-circuit comprises a reset control transistor, a control terminal of the reset control transistor is coupled to the reset response voltage line, an input terminal of the reset control transistor is coupled to a reference direct current voltage terminal, and an output terminal of the reset control transistor is coupled to the output terminal of the driving transistor.

8. The pixel driving circuit according to claim 1, wherein the preset voltage terminal is the driving voltage terminal.

9. The display panel according to claim 1, further comprising:
a reset sub-circuit configured to pull down a voltage at one end of the storage capacitance coupled to the sub-pixel to a reset voltage, in response to a reset response voltage output by a reset response voltage line.

10. The display panel according to claim 9, wherein the reset response voltage line is the first gate control signal line; and/or
the reset sub-circuit comprises a reset control transistor, a control terminal of the reset control transistor is coupled to the reset response voltage line, an input terminal of the reset control transistor is coupled to a reference direct current voltage terminal, and an output terminal of the reset control transistor is coupled to the output terminal of the driving transistor.

11. The pixel driving circuit according to claim 1, wherein the preset voltage terminal is a direct current signal terminal in the display panel.

12. A display panel, comprising: a plurality of pixels and a plurality of the pixel driving circuits, wherein each of the plurality of pixels comprises a plurality of sub-pixels, and the plurality of sub-pixels in the plurality of pixels are coupled with the plurality of pixel driving circuits, respectively;
wherein each of the plurality of pixel driving circuits comprises:
a driving and compensation sub-circuit, wherein the driving and compensation sub-circuit comprises a driving transistor and a storage capacitance, an input terminal of the driving transistor is coupled to a driving voltage terminal, a control terminal of the driving transistor is coupled to one end of the storage capacitance, and an other end of the storage capacitance and an output terminal of the driving transistor are commonly coupled to a corresponding sub-pixel of the plurality of sub-pixels; and
a voltage stabilizing transistor, wherein an input terminal of the voltage stabilizing transistor is coupled to a preset voltage terminal, an output terminal of the voltage stabilizing transistor is coupled to a control terminal of the driving transistor, and a control terminal of the voltage stabilizing transistor is coupled to a first gate control signal line;
wherein a gate metal layer of a gate electrode of the voltage stabilizing transistor that serves as the control terminal of the voltage stabilizing transistor, and an active layer constitute a channel on-state capacitance, a ratio of an area of the channel on-state capacitance to a capacitance value of the storage capacitance is less than a preset value, wherein the area of the channel on-state capacitance is a directly opposite overlapping area between the gate metal layer and the active layer, and the preset value is determined based on a ratio of a voltage fluctuation for driving the control terminal of the driving transistor to a potential voltage.

13. A display device, comprising the display panel according to claim 12.

14. The display panel according to claim 12, wherein a ratio of the voltage fluctuation at the control terminal of the driving transistor to the potential voltage is 5%, and the preset value is $3.74\ E^{-10}$ correspondingly.

15. The display panel according to claim 12, further comprising:
a data write sub-circuit, wherein an output terminal of the data write sub-circuit is coupled between the output terminal of the driving transistor and an input terminal of the sub-pixel, and is configured to write a data voltage into the driving transistor in a compensation and writing stage.

16. The display panel according to claim 15, wherein the data write sub-circuit comprises:
   a writing control transistor, wherein a control terminal of the writing control transistor is coupled to a second gate control signal line, an input terminal of the writing control transistor is coupled to a data voltage terminal, and an output terminal of the writing control transistor is coupled to the output terminal of the driving transistor.

17. The display panel according to claim 15, further comprising:
   a first luminance control transistor, wherein a control terminal of the first luminance control transistor is coupled to a first luminance control signal line, an input terminal of the first luminance control transistor is coupled to the driving voltage terminal, and an output terminal of the first luminance control transistor is coupled to the input terminal of the driving transistor; and
   a second luminance control transistor, wherein a control terminal of the second luminance control transistor is coupled to a second luminance control signal line, an input terminal of the second luminance control transistor is coupled to the output terminal of the driving transistor, and an output terminal of the second luminance control transistor is coupled to the sub-pixel.

18. The display panel according to claim 12, wherein the preset voltage terminal is the driving voltage terminal.

19. The display panel according to claim 12, wherein the preset voltage terminal is a direct current signal terminal in the display panel.

* * * * *